(12) United States Patent
Park et al.

(10) Patent No.: US 7,688,137 B2
(45) Date of Patent: Mar. 30, 2010

(54) LOW POWER CONSUMING MIXED MODE POWER AMPLIFIER

(75) Inventors: Min Park, Daejeon (KR); Tae-Young Kang, Seoul (KR); Byoung-Gun Choi, Daegu (KR); Yun-Ho Choi, Daejeon (KR); Byung-Jo Kim, Daejeon (KR); Young-Ho Kim, Daejeon (KR); Kyung-Hwan Park, Daejeon (KR); Seok-Bong Hyun, Daejeon (KR); Nak-Woong Eum, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 49 days.

(21) Appl. No.: 12/023,449

(22) Filed: Jan. 31, 2008

(65) Prior Publication Data

US 2009/0039960 A1 Feb. 12, 2009

(30) Foreign Application Priority Data

Aug. 10, 2007 (KR) .................. 10-2007-0080480

(51) Int. Cl.
*H03F 3/68* (2006.01)
(52) U.S. Cl. ........................... 330/133; 330/278
(58) Field of Classification Search ............. 330/133, 330/295, 124 R, 285, 296, 310, 260, 261, 330/253
See application file for complete search history.

(56) References Cited

U.S. PATENT DOCUMENTS

| | | | |
|---|---|---|---|
| 5,872,481 A | | 2/1999 | Sevic et al. |
| 5,903,854 A | * | 5/1999 | Abe et al. .......... 455/575.1 |
| 6,029,526 A | | 2/2000 | Feldman et al. |
| 6,069,526 A | | 5/2000 | Ballantyne |
| 6,208,202 B1 | | 3/2001 | Kaufman et al. |
| 6,700,440 B2 | | 3/2004 | Hareyama et al. |
| 6,724,252 B2 | | 4/2004 | Ngo et al. |
| 6,781,455 B2 | | 8/2004 | Kim et al. |
| 6,900,692 B2 | | 5/2005 | Kim et al. |
| 7,157,966 B2 | * | 1/2007 | Baree et al. .......... 330/133 |
| 7,444,124 B1 | * | 10/2008 | Loeb et al. .......... 455/127.3 |
| 2008/0218270 A1 | * | 9/2008 | Hau et al. .......... 330/289 |

FOREIGN PATENT DOCUMENTS

| | | |
|---|---|---|
| JP | 2003-298360 A | 10/2003 |
| KR | 2004-0046461 A | 6/2004 |
| KR | 2007-0041868 A | 4/2007 |

OTHER PUBLICATIONS

"Average current reduction in (W)CDMA power amplifiers", Teeter, D.A. et al, Radio Frequency Integrated Circuits (RFIC) Symposium, 2006, IEEE, Jun. 11-13, 2006.

* cited by examiner

*Primary Examiner*—Robert Pascal
*Assistant Examiner*—Hieu P Nguyen
(74) *Attorney, Agent, or Firm*—Rabin & Berdo, PC

(57) ABSTRACT

A low power consuming mixed mode power amplifier which includes: a low output amplifier circuit generating a power amplified result having high efficiency in a low output mode that is most frequently used; a high output amplifier circuit generating an amplified result having high linearity in a high output mode of a region consuming the most power; and an amplifier controller selectively activating the low and high output amplifier circuits according to a power level of an input signal. The high and low output amplifier circuits have a predetermined gain difference.

24 Claims, 11 Drawing Sheets

LOW POWER CONSUMING MIXED MODE POWER AMPLIFIER

CROSS-REFERENCE TO RELATED APPLICATIONS

This U.S. non-provisional patent application claims priority under 35 U.S.C. §119 of Korean Patent Application No. 10-2007-0080480, filed on Aug. 10, 2007, issued on Jan. 29, 2009 as Korean Patent No. 100880448 B1, the entire contents of which are hereby incorporated by reference.

BACKGROUND OF THE INVENTION

The present invention disclosed herein relates to a power amplifier in a wireless communication terminal and system, and more particularly, to a mixed mode power amplifier with at least two operating modes.

This present invention is derived from researches accomplished as a part of IT R & D program of the Ministry of Information and Communication and Institution of Information Technology Association (MIC/IITA) [2005-S-017-03], Integrated development of ultra low power RF/HW/SW SoC.

According to the recent development of information communication technology, various contents such as movies, images, music contents, e-Books, etc are actively in service, based on a communication infrastructure of various forms such as high-speed internet, wireless internet, portable internet, terrestrial digital multimedia broadcasting (DMB), satellite DMB, etc. When considering a current technology development trend, the future mobile terminal can provide diverse services such as voice, internet, movie, and electronic signature/measurement/control, different from a typical voice based service. To realize those, complex functions and high transmission speed are required, and together with them, power consumption is one of the most important rising issues.

A power amplifier, a key component of signal transmission, is the most power consuming device in mobile communication terminals. By lowering the power consumption of the power amplifier in a mobile communication terminal and a mobile phone, multi-functions and complex functions of a low power consuming system can be realized. As a result, new mobile communication service industry can be revitalized, and thus each individual can enjoy services of various convenient functions through one terminal. Moreover, because it is possible for a user to enjoy multimedia communication for an extraordinarily long time, a leading information exchange society can be realized regardless of time and space. Accordingly, to maintain superior competitive power of a mobile terminal in a global market in an economic aspect and to create various additional services, a low power consuming component must be realized.

FIG. 1 is a block diagram of a typical mixed mode power amplifier.

Referring to FIG. 1, the power amplifier includes a high output amplifier unit 10 amplifying a radio frequency (RF) input signal, a mode switch 20 determining consumption current $I_1$ and $I_2$ of the high output amplifier unit 10, an input impedance-matching circuit 30 matching an input impedance of the high output amplifier unit 10, and an output impedance-matching circuit 40 matching an output impedance of the high output amplifier unit 10. The power amplifier of FIG. 1 is a mixed mode power amplifier capable of switching into a low output mode or a high output mode, an example of which is disclosed in U.S. Pat. No. 6,069,526 titled "PARTIAL OR COMPLETE AMPLIFIER BYPASS", and filed on May 30, 2000 by Ballantyne.

Currently, the high-output amplifier 10 mainly uses one of a heterojunction bipolar transistor (HBT) array, a bipolar junction transistor (BJT) array, a field effect transistor (FET) array, and a complementary metal oxide semiconductor (CMOS) array. Generally, the typical power amplifier has very low power efficiency when an RF output power is less than a direct current (DC) consumption power. To resolve this limitation, as illustrated in FIG. 1, the mixed mode power amplifier operating in a high output mode or a low output mode according to the intensity of an output power has been suggested.

The consumption current $I_1$ or $I_2$ in the high or low output mode of the mixed mode power amplifier is determined by the mode switch 20. The consumption current $I_2$ in the low output mode is lower than the consumption current $I_1$ in the output mode. Generally, a supply voltage of the power amplifier is determined with a battery supply voltage (e.g., about 3.4 V to about 4.2 V in a case of a mobile phone). Accordingly, power consumption of the power amplifier is determined by an amount of the supply DC current.

When an RF input is enhanced in the high output amplifier 10, an RF power outputted from the high output amplifier 10 is increased together with the consumed DC current. At this point, a voltage swing width for generating the maximum output power is determined by a battery supply voltage level in the high output mode of about 1 W. In the high output power mode, a load impedance of about 2 Ohm to about 5 Ohm is used to adjust a current swing width. Compared to this, since the output power is low in the low output mode of about 16 dBm, instead of significantly increasing current consumption, the load impedance of more than about 15 Ohm is used to allow a RF voltage swing size to approach a battery supply voltage width. Therefore, the power efficiency can be improved.

If the output impedance between the high output mode and the low output mode of the power amplifier is identically shared, first in order to meet the maximum output requirement of the mobile phone, the load impedance needs to be sufficient to the high output mode. Accordingly, even if the consumption current $I_1$ and $I_2$ of the operating point in the high and low output modes changes through the mode switching, due to the limitation of the load impedance, the efficiency in the low output mode of less than about 16 dBm may not be more than about 10%. In this case, if the consumption current $I_1$ and $I_2$ in the two modes is decreased gradually, the efficiency may increase. On the other hand, characteristics of the non-linearity occur in a signal operation of the high output mode. This deteriorates linearity of the power amplifier. Therefore, there is a limitation in realizing a power amplifier that is capable of maintaining high linearity and having high efficiency in the high and low output modes, only by simply changing the consumption current $I_1$ and $I_2$, i.e., a simple mode switching operation.

FIG. 2 is a graph of probability density functions according to outputs of a code division multiple access (CDMA) mobile communication terminal and mobile phone. The graph of FIG. 2 is listed in IEEE Radio Freq. Integr. Circuits (RFIC) Symp. Dig., pp. 429-432 of the dissertation titled "Average current reduction in (W) CDMA power amplifiers" by D. A. Teeter, E. T. Spears, H. Bui, H. Jiang, and D. Widay. The graph of FIG. 2 illustrates probability density according to outputs of mobile communication terminal and a mobile phone in urban and suburban areas.

Referring to FIG. 2, actual usage rates of a mobile communication terminal and a mobile phone is concentrated on a region (i.e., a low output mode region) where an output power is less than about 16 dBm. However, load impedance for the maximum efficiency of the voltage amplifier circuit is designed for the high output mode in order to satisfy the maximum output requirement. For that reason, the power efficiency is rather decreased in the low output mode with the highest actual usage rate.

Recently, to describe the efficiency improvement of the power amplifier in the system such as a mobile communication terminal and a mobile phone, a notion for the average power usage efficiency (APUE) is used. The APUE is defined by a ratio of the supplied DC power and the average output power as following Equation 1 and Equation 2.

$$\eta_{USE} = \frac{<P_{OUT,i}>}{<P_{IN,i}>} \quad \text{[Equation 1]}$$

$$\eta_{USE} = \frac{\sum_{i=1}^{M} pdf(P_{OUT,i}) \cdot P_{OUT,i}}{\sum_{i=1}^{M} pdf(P_{OUT,i}) \cdot I_{C,i} \cdot V_{CC,i}} \quad \text{[Equation 2]}$$

where $<P_{OUT,i}>$ and $<P_{IN,i}>$ represent an average RF output power and a supplied DC power consumption according to pdf of a power amplifier, respectively. Pdf represents a probability function value according to output as illustrated in FIG. 2.

Generally, the maximum output power represents the most important characteristic in the CDMA power amplifier. However, most of the amplifiers operate at a low output power (i.e., in a low output mode region) of about 0 dBm in an urban area as illustrated in FIG. 2. The probability of 28 dBm output power is about 0.2% and the probability of a low output level. e.g. 0 dBm output power, is more than 3%. The probability distribution function has a form similar to the Gaussian distribution curve. An integral value calculated by a pdf function up to 16 dBm is about 94%. Accordingly, to increase a battery usage time of a terminal, the efficiency of a power unit in a power amplifier needs to be increased in an area where usage frequency is statistically high.

SUMMARY OF THE INVENTION

The present invention provides a mixed mode power amplifier capable of providing high power usage efficiency and reducing power consumption.

The present invention also provides a mixed mode power amplifier capable of maximizing the efficiency in the most frequently used region in order to extend a battery usage time.

The present invention further provides a mixed mode power amplifier capable of freely adjusting a gain difference of a high output amplifier and a low output amplifier in order to easily perform a power level adjustment of a system.

Embodiments of the present invention provide power amplifiers including: a low output amplifier circuit generating a power amplified result having high efficiency in a low output mode the most frequently used; a high output amplifier circuit generating an amplified result of high linearity in a high output mode of a region consuming the most power; an amplifier controller selectively activating the low and high output amplifier circuits according to a power level of an input signal. The high and low output amplifier circuits have a predetermined gain difference.

In other embodiments of the present invention, power amplifiers include: a low output amplifier unit generating a power amplified result having high efficiency in a low output mode the most frequently used; a high output amplifier unit generating an amplified result of high linearity in a high output mode of a region consuming the most power; a gain controller amplifying an input signal through a plurality of amplifier units having a predetermined gain difference, and providing the amplified result to the high and low output amplifier units; and an amplifier controller selectively activating the low and high output amplifier units according to a power level of the input signal.

In still other embodiments of the present invention, power amplifiers include: an input impedance-matching unit configured to impedance match an input signal; a first amplifier unit amplifying the input impedance-matching result; a first intermediate impedance-matching unit configured to impedance match the amplified result of the first amplifier unit; a low output amplifier unit amplifying the first intermediate impedance-matching result in a low output mode; a second amplifier unit amplifying the first intermediate impedance-matching result in a high output mode; a second intermediate impedance-matching unit configured to impedance match the amplified result of the second amplifier unit in the high output mode; a high output amplifier unit amplifying the second intermediate impedance-matching result in the high output mode; an amplifier controller controlling amplification operations of the low output amplifier unit, the second amplifier unit, and the high output amplifier unit in response to a power level of the input signal; and an output impedance-matching unit configured to impedance match the amplified results of the low and high output amplifier units.

In even other embodiments of the present invention, power amplifiers include: an input impedance-matching unit configured to impedance match an input signal; a first amplifier unit amplifying the input impedance-matching result; a first intermediate impedance-matching unit configured to impedance-match the amplified result of the first amplifier unit; a low output amplifier unit including a plurality of non-linear amplifier units with respectively different high efficiency operation regions to amplify the first intermediate impedance-matching result in a low output mode; a second amplifier unit amplifying the first intermediate impedance-matching result in a high output mode; a second intermediate impedance-matching unit configured to impedance match the amplified result of the second amplifier unit in the high output mode; a high output amplifier unit amplifying the second intermediate impedance-matching result in the high output mode; an amplifier controller controlling amplification operations of the low output amplifier unit, the second amplifier unit, and the high output amplifier unit in response to a power level of the input signal; and an output impedance-matching unit configured to impedance match the amplified results of the low and high output amplifier units.

According to the present invention, the low consuming mixed mode power amplifier provides high efficiency through a non-linear amplifier in a low output mode and satisfies its linearity to obtain desired output through high linearity in a high output mode. Consequently, high power usage efficiency is provided and power consumption can be reduced.

According to the low consuming mixed mode power amplifier of the present invention, the power efficiency is improved in a low output mode corresponding to the most frequently used region, such that the power efficiency of the power amplifier can be effectively increased.

Additionally, according to the low consuming mixed mode power amplifier of the present invention, a plurality of non-linear amplifiers connected in parallel constitutes a low output amplifier, such that the optimized points that provide the maximum efficiency are obtained. Therefore, efficiency of the power amplifier is maximized and battery usage time of a mobile communication terminal and a mobile phone can be extended.

Additionally, according to the low consuming mixed mode power amplifier of the present invention, because a gain difference of a high output amplifier and a low output amplifier can be freely adjusted, a power level of a system can be easily adjusted.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

A low power consuming mixed mode power amplifier of the present invention provides high power efficiency through a non-linear amplifier in a low output mode and satisfies its linearity to provide a desired output through a high linear amplifier in a high output mode. The high output amplifier and the low output amplifier are configured to have a gain difference. The gain difference can be freely adjusted and a power level of a system is easily adjusted accordingly. The low output amplifier includes a plurality of non-linear amplifier units connected in parallel. Consequently, since the optimized points providing the maximum efficiency can be obtained, the efficiency of the power amplifier can be maximized and a battery usage time of a mobile communication terminal and a mobile phone can be extended. The detailed structure of the low power consuming mixed mode power amplifier is as follows.

Figure 3A:
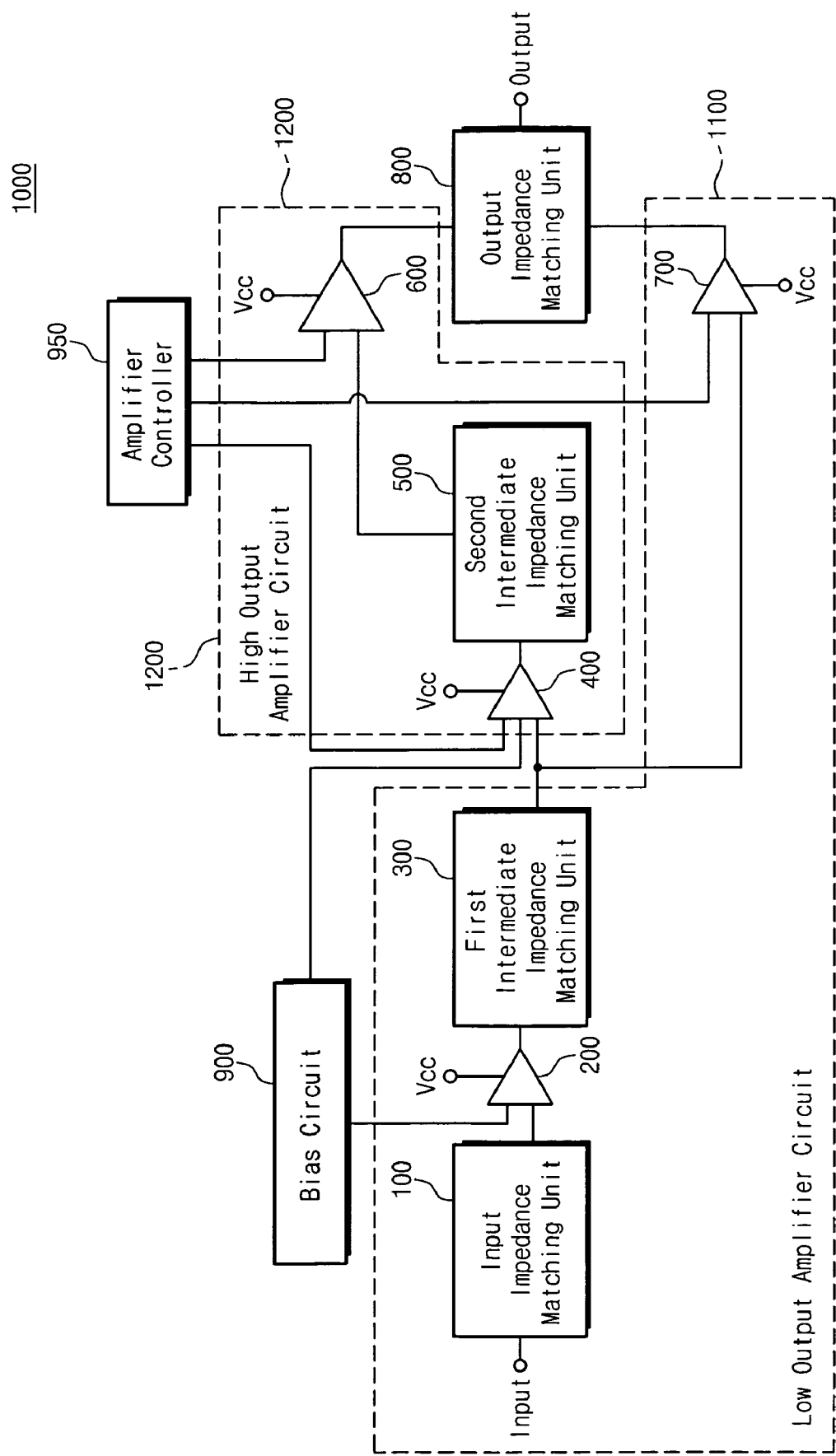
FIGS. 3A and 3B are block diagrams of a power amplifier according to an embodiment of the present invention.
Figure 3B:
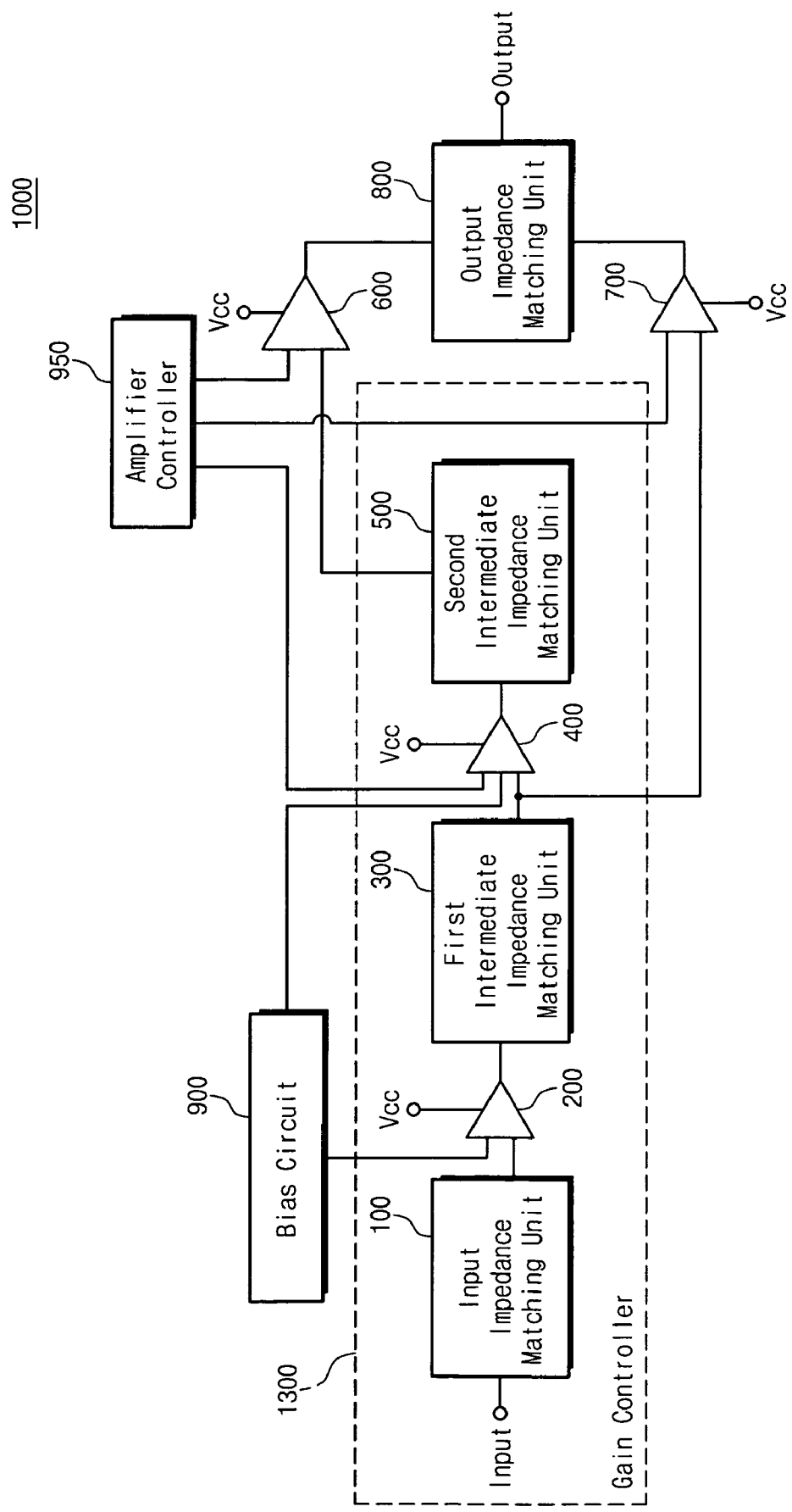

FIGS. 3A and 3B are block diagrams of a power amplifier 1000 according to an embodiment of the present invention.

Referring to FIGS. 3A and 3B, the mixed mode power amplifier 1000 includes an input impedance-matching unit 100, a first amplifier unit 200, a first intermediate impedance-matching unit 300, a second amplifier unit 400, a second intermediate impedance-matching unit 500, a high output amplifier unit 600, a low output amplifier unit 700, an output impedance-matching unit 800, a bias circuit 900, and an amplifier controller 950. Function blocks 100 to 950 constituting the mixed mode power amplifier 1000 include a low output amplifier circuit 1100, a high output amplifier circuit 1200, and a gain controller 1300 according to functions of the function blocks 100 to 950 as illustrated in FIGS. 3A and 3B. However, each of the power amplifiers 1000 of FIGS. 3A and 3B includes different results 1100 to 1300 that are functionally divided according to functions of the blocks 100 to 950. Each structure itself of the function blocks 100 to 950 is substantially the same. Accordingly, the same reference number refers to the same block.

First, referring to FIG. 3A, the mixed mode power amplifier 1000 includes the low power amplifier circuit 1100, the high output amplifier circuit 1200, the amplifier controller 950, and the bias circuit 900. The low power amplifier circuit 1100 includes the input impedance-matching unit 100, the first amplifier unit 200, the first intermediate impedance-matching unit 300, and the low output amplifier unit 700. The low output amplifier circuit 1100 generates a power amplified result having high efficiency in the low output mode the most frequently used. The high output amplifier circuit 1200 includes the second amplifier unit 400, the second intermediate impedance-matching unit 500, and the high output amplifier unit 600. The high output amplifier circuit 1200 generates an amplified result having high linearity in the high output mode of the most power consuming region. The bias circuit 900 is connected to the first and second amplifier units 200 and 300 to provide a drive voltage. The amplifier controller 950 selectively activates the low output amplifier circuit 1100 and the high output amplifier circuit 1200 according to a power level of an input signal. The mixed mode power amplifier 1000 is configured to have a predetermined gain difference between the high output amplifier circuit 1200 and the low output amplifier circuit 1100.

Referring to FIG. 3B, the mixed mode power amplifier 1000 includes the low output amplifier unit 700, the high output amplifier unit 600, the gain controller 1300, the amplifier controller 950, and the bias circuit 900. The gain controller 1300 includes the input impedance-matching unit 100, the first amplifier unit 200, the first intermediate impedance-matching unit 300, the second amplifier unit 400, and the second intermediate impedance-matching unit 500. The gain controller 1300 amplifies an input signal through a plurality of amplifier units having a predetermined gain difference, and then provides the amplified result to the low and high output amplifier units 700 and 600. The gain controller 1300 amplifies an input signal to obtain gain required by the system through the first and second amplifier units 200 and 400. The bias circuit 900 is connected to the first and second amplifier units 200 and 400 to provide a drive voltage. The amplifier controller 950 selectively activates the low and high output amplifier circuits 700 and 600 according to a power level of an input signal. The low output amplifier unit 700 generates a power amplified result having high efficiency in the most frequently used low output mode in response to control of the amplifier controller 950. The high output amplifier unit 600 generates an amplified result having high linearity in the high output mode of the most power consuming region in response to control of the amplifier controller 950.

Referring to FIGS. 3A and 3B, each of the function blocks 100 to 950 constituting the mixed mode power amplifier 1000 is as follows.

The bias circuit 900 is connected to one point of a path between the input impedance-matching unit 100 and the first intermediate impedance-matching unit 300 in order to provide a drive voltage to the first and second amplifier units 200 and 400. The input impedance-matching unit 100 outputs a radio frequency (RF) signal through impedance-matching, which is inputted from the outside. The first amplifier unit 200 receives and amplifies the signal outputted from the input impedance-matching unit 100. The first intermediate matching unit 300 receives the amplified high frequency signal from the first amplifier unit 200 and outputs it through appropriate impedance-matching. The impedance-matching result of the first intermediate impedance-matching unit 300 is provided into the second amplifier unit 400 and the low output amplifier unit 700. Here, the first amplifier unit 200 and the low output amplifier unit 700 can be realized by a bipolar transistor. However, it is apparent to those skilled in the art that the first amplifier unit 200 and the low output amplifier unit 700 can be realized by one (or, combination) of a heterojunction bipolar transistor (HBT) array, a bipolar junction transistor (BJT) array, a field effect transistor (FET) array, and a complementary metal oxide semiconductor (CMOS) array.

The second amplifier unit 400 receives and amplifies the signal outputted from the first intermediate impedance-matching unit 300. The second amplifier unit 400 operates in the high output mode (e.g., region where an output power is more than about 16 dBm) of the most power consuming region according to control of the amplifier controller 950. A structure of an amplifier including the first and second amplifier units 200 and 400 serve as a gain controller providing a gain required by the system. Especially, when realizing an amplifier operating in a high frequency region, because a gain of the unit itself is small, the present invention connects a plurality of amplifier units in series in order to satisfy system requirements, such that a gain can be increased. Additionally, the number of amplifier units may vary depending on overall signal amplification degree required in the system. For example, in a case where a low amplification degree is required, the first amplifier unit 200 and the first intermediate impedance-matching unit 300 can be omitted. In a case where a high overall signal amplification degree is required, as illustrated in FIGS. 9 through 13, the first amplifier unit (or, the second amplifier unit) can be realized through a multi-stage amplifier including a plurality of amplifier units.

Although it will be described in detail below, the second amplifier unit 400 and the high output amplifier unit 600 operate in the high output mode, and do not operate in the low output mode (e.g., a region where an output power is below about 16 dBm). Accordingly, the second intermediate impedance-matching unit 500 connected between the second amplifier unit 400 and the high output amplifier unit 600 substantially operate in the high output mode in which the second amplifier unit 400 and the high output amplification 600 operate. Moreover, the second intermediate impedance-matching unit 500 does not operate in the low output mode in which the second simplification unit 400 and the high output amplifier unit 600 do not operate. During the high output mode operation, the second intermediate impedance-matching unit 500 receives a high frequency signal amplified in the second amplifier unit 400, and outputs it through an appropriate impedance-matching. The impedance-matching result of the second intermediate impedance-matching unit 500 is provided into the high output amplifier unit 600. According to the present invention, a region where an output power is over than about 16 dBm and a region where an output power is less than about 16 dBm will be described as a high output mode and a low output mode, respectively. However, a boundary point between the high output mode region and the low output mode region is just one example to which the present invention is applied. The boundary point may be changed and modified in various forms.

The high output amplifier unit 600 includes a high linear amplifier unit having high linearity. For example, the high output amplifier unit 600 may include a high linear amplifier unit of class A or class AB. The high output amplifier unit 600 operates in the high output mode of the most power consuming region according to control of the amplifier controller 950 and receives a signal outputted from the second intermediate impedance-matching unit 500 to amplify the signal. The area of the high output amplifier unit 600 may be realized larger than the area of the first amplifier unit 200 and the low output amplifier unit 700. Here, the most power consuming region means a region obtaining the maximum power in the power amplifier unit, and an interval during which the maximum power can be obtained as long as the linearity is maintained in a terminal. In this case, a load current has a high value (or, the maximum value).

The low output amplifier unit 700 includes a non-linear amplifier unit of high power consumption efficiency, and operates in the low output mode (e.g., a region where an output power is below about 16 dBm) of the most frequently used region according to control of the amplifier controller 950. A voltage path of the second amplifier unit 400, the second intermediate impedance-matching unit 500, and the high output amplifier unit 600, which are connected in series, is connected in parallel to the low output amplifier unit 700. The low output amplifier unit 700 receives and amplifies a signal outputted from the first intermediate impedance-matching unit 300. A gain of the power amplifier unit in the high and low output modes has a difference as much as a gain of the second amplifier unit 400. The low output amplifier unit 700 includes a non-linear amplifier unit of class E having high voltage efficiency characteristic. Generally, when observing the classes used in the power amplifier unit, class D, class E, and class F performing a linear operation have higher efficiency characteristic than class A, class AB, and class B performing a linear operation. The non-linear power amplifier unit uses non-linearity of a transistor in a high input power state. The output power of the non-linear amplifier unit does not use a method of modulating an input power and is adjusted through a method of modulating a bias voltage Vcc. Therefore, a high input power is necessary to utilize switching characteristic of a transistor.

That is, the low power consuming mixed mode power amplifier 1000 divides a power terminal of a power amplifier into more than one, and activates the low output amplifier unit 700 including a non-linear amplifier unit of class E in order to obtain high efficiency in the low output mode. The amplified result of the activated low output amplifier unit 700 is impedance-matched through the output impedance-matching unit 800, and then is outputted as the power amplified result of the low output mode. To achieve the maximum power characteristic in the low output mode operation, it is important to control the output impedance-matching unit 800 to obtain the maximum added efficiency through impedance-matching.

Figure 1:
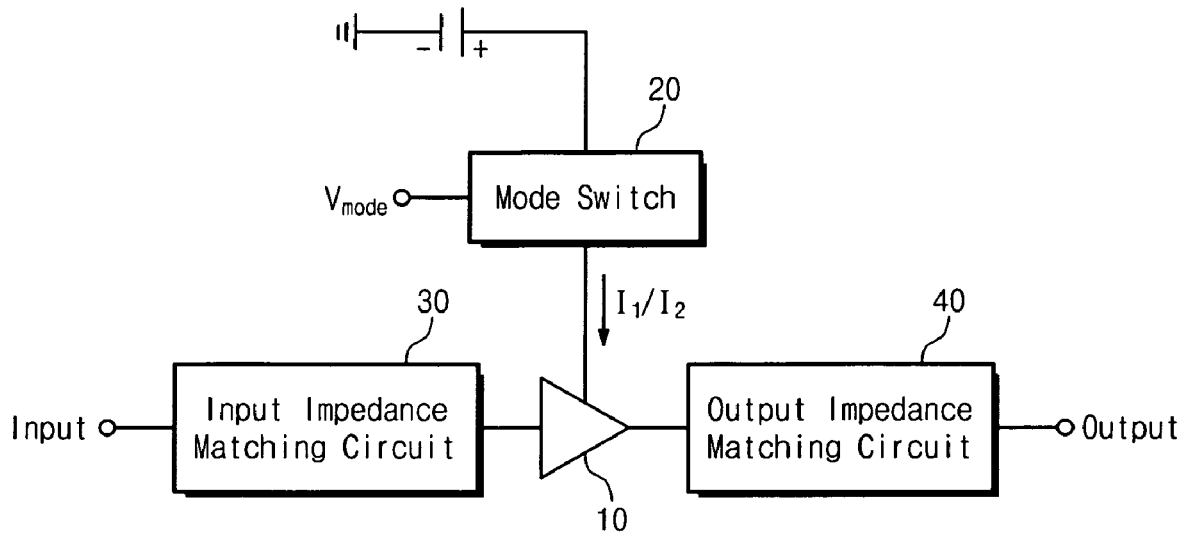
FIG. 1 is a block diagram of a typical mixed mode power amplifier.
Figure 2:
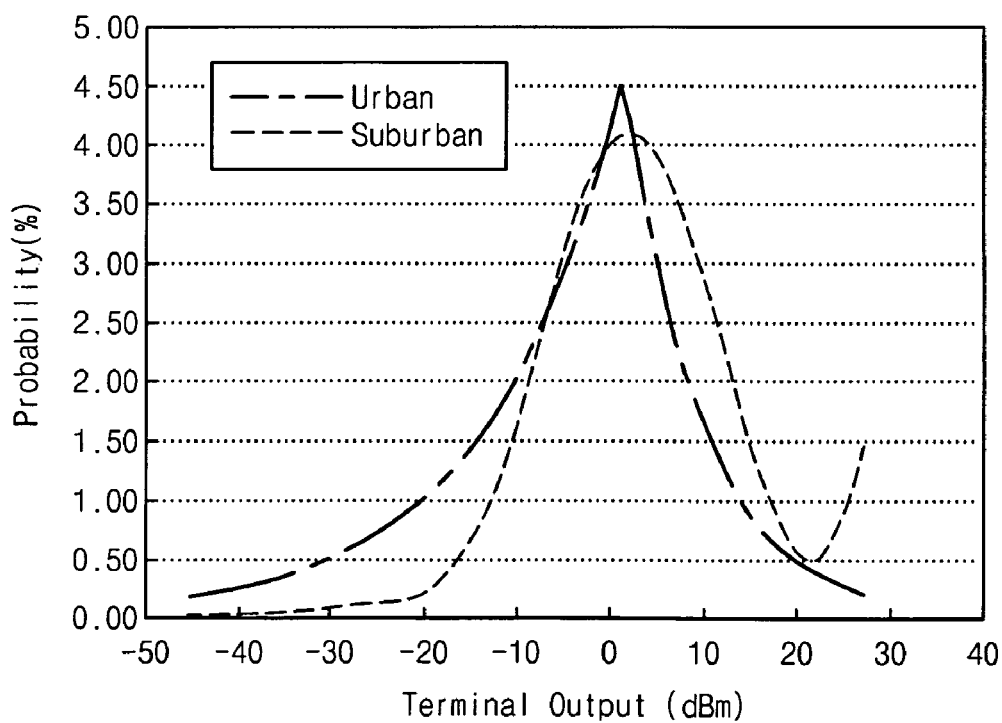
FIG. 2 is a graph of probability density functions according to outputs of a CDMA mobile communication terminal and a mobile phone.

The low output mode corresponds to the most frequently used region of a mobile communication terminal and a mobile phone. A predetermined collector voltage is supplied to the low output amplifier unit 700, and an input voltage lower than an input power necessary for switching characteristic (i.e., a quasi_class E operation) in a transistor is supplied to the low output amplifier unit 700. By designing P1 dB of the low output amplifier unit 700 with more than about 16 dBm, a linear standard of a system can be satisfied. Here, P1 dB represents "1 dB Gain Compression Point", and means the maximum power point that is actually usable before the power amplifier reaches a saturated power. That is, the maximum power point is the maximum linear output power that is stably usable in the power amplifier. Accordingly, although the low output amplifier unit 700 includes a non-linear amplifier unit of class E, P1 dB is designed to be above about 16 dBm, the linearity is guaranteed for the most frequently used region (i.e., a region below about 16 dBm in FIG. 2). Therefore, the low output amplifier unit 700 is not the amplifier unit of class E performing a complete switching operation, and has higher efficiency than a general power amplifier unit. Due to this characteristic improvement, the power efficiency of the power amplifier can be maximized.

Additionally, the low power consuming mixed mode power amplifier 1000 activates the high output amplifier unit 600 including a high linear amplifier unit in a high output mode. The high output amplifier unit 600 includes a high linear amplifier unit of class A or class AB to guarantee high linearity. The amplified result of the activated high output amplifier unit 600 is impedance-matched through the output impedance-matching unit 800, and then is outputted as the power amplified result in the high output mode. To obtain the maximum characteristic in the high output mode operation, it is important to control the output impedance-matching unit 800 for impedance-matching in order to maintain high linearity. According to this structure, the power amplifier 1000 of the present invention satisfies the linearity in the high output mode, and also improves the power efficiency in the most frequently used low output mode. As a result, a battery usage time can be effectively extended.

The amplifier controller 950 controls the second output amplifier unit 400, the high output amplifier unit 600, and the low output amplifier unit 700 by adding a digital signal according to the high/low output mode. Typical digital signal control technique is applied to the above. For example, the amplifier controller 950 generates a power control signal based on an external antenna output signal. In response to the generated power control signal, the low output amplifier unit 700 is turned off, and the second amplifier unit 400 and the high output amplifier unit 600 are turned on for driving during the high output mode operation. At this point, a gain of the amplifier unit 1000 in the high and low output modes has a difference as much as a gain of the second amplifier unit 400. The gain difference of the high and low output amplifier units may be freely adjustable and due to this, power level adjustment of a system can be easily performed.

Figure 4:
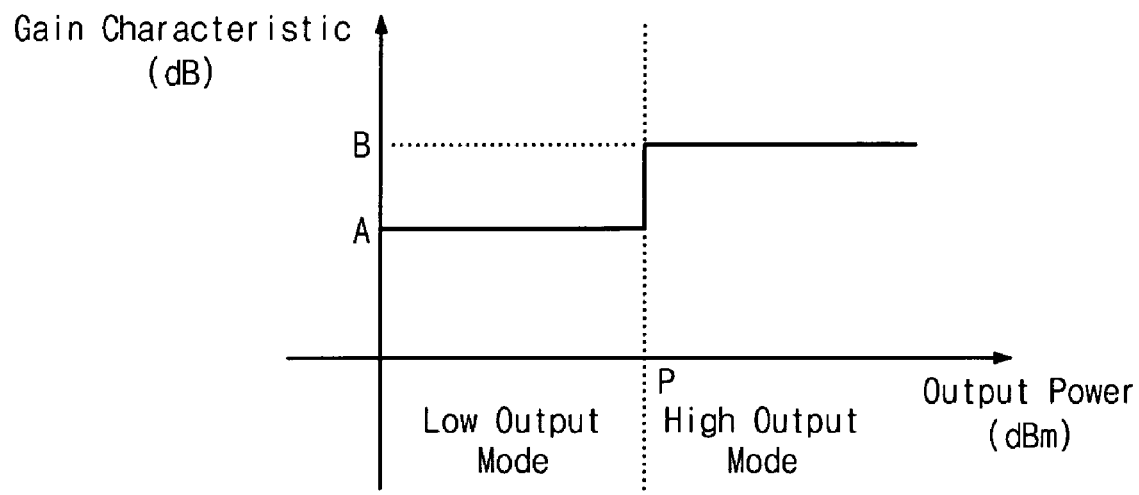
FIG. 4 is a graph illustrating gain characteristics according to a low output mode and a high output mode in a low power consuming mixed mode power amplifier of FIGS. 3A and 3B.

FIG. 4 is a graph illustrating gain characteristics according to a low output mode and a high output mode in the low power consuming mixed mode power amplifier 1000 of FIGS. 3A and 3B.

Referring to FIGS. 3A and 3B and FIG. 4, the second amplifier unit 400 and the high output amplifier unit 600 are turned off in the low power consuming mixed mode power amplifier 1000 according to control of the amplifier controller 950 in a low output mode. In this case, the matching result of the first intermediate impedance-matching unit 300 is not amplified by the second amplifier unit 400 and the high output amplifier unit 600 and is directly provided to the low output amplifier unit 700. Accordingly, there is no gain characteristic by the second amplifier unit 400 and the high output amplifier unit 600 in the low output mode. Therefore, low gain characteristics exist in the low output mode compared to the high output mode (referring to a solid line in the low output mode region of FIG. 4). At this point, a gain of the power amplifier 1000 in the high and low output modes has a difference as much as a gain of the second amplifier unit 400. The gain difference between the high output amplifier unit 600 and the low output amplifier unit 700 may be freely adjustable, and due to this, a power level adjustment of a system can be easily performed. Additionally, during the low output mode of the power amplifier 1000, since there are no gain characteristics through the second amplifier unit 400 and the high output amplifier unit 600, the DC power consumption by the second amplifier unit 400 and the high output amplifier unit 600 can be effectively reduced. Accordingly, characteristics of the power added efficiency can be improved. The characteristics of the power added efficiency will be described in more detail with reference to the FIG. 6.

The low output amplifier unit 700 is turned off in the low power consuming mixed mode amplifier 1000 during the high output mode according to control of the amplifier controller 950. Therefore, the impedance result of the first intermediate impedance-matching unit 300 is not amplified by the low output amplifier unit 700, and is provided to the high output amplifier unit 600 through the second amplifier unit 400 and the second intermediate impedance-matching unit 700. In this case, high gain characteristics are shown when an output mode changes from the low output mode into the high output mode (referring to a solid line in the high output mode region of FIG. 4). At this point, characteristics of the power added efficiency of the low power consuming mixed mode power amplifier 1000 is determined by a high output amplifier unit 600 having an overall high output power level.

To obtain the maximum characteristics during the high and low output modes, it is important to control the output impedance-matching unit 800 for impedance-matching in order to obtain the maximum added efficiency in the low output mode. Additionally, according to this impedance-matching, it is important to control high linearity during a high output mode operation.

Figure 5:
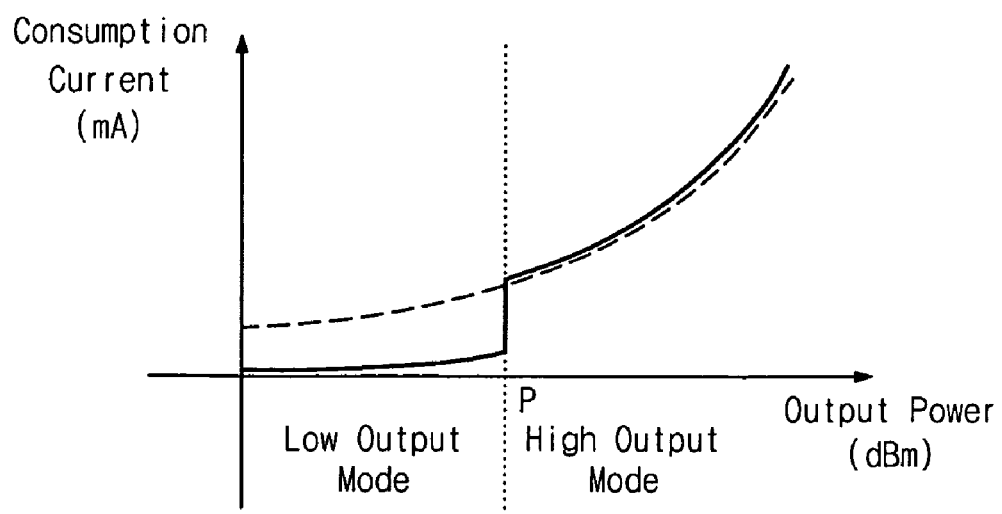
FIG. 5 is a graph illustrating consumption current characteristics according to low and high output modes of a low power consuming mixed mode power amplifier of FIGS. 3A and 3B.

FIG. 5 is a graph illustrating consumption current characteristics according to low and high output modes of the low power consuming mixed mode power amplifier 10000 of FIGS. 3A and 3B.

Referring to FIGS. 3A and 3B and FIG. 5, a consumption current exists only by the low output amplifier unit 700 in the low output mode, and also a consumption current exists only by the second amplifier unit 400 and the high output amplifier unit 600 in the high output mode. Accordingly, when the low output mode changes into the high output mode at a predetermined point P like the solid line of FIG. 5, difference occurs in the consumption current according to each operational mode. The portion displayed in the dotted line of FIG. 5 represents consumption current characteristics of a typical power amplifier, which does not turn off the second amplifier unit 400 and the high output amplifier unit 600 in the low output mode operation. The portion displayed in the solid line of FIG. 5 represents consumption current characteristics of the power amplifier 100, which turns off the second amplifier unit 400 and the high output amplification 600 during the low output mode operation. Referring to FIG. 5, according to the power amplifier 1000, because a current is not consumed by the second amplifier unit 400 and the high output amplifier unit 600 during the low power mode operation, less consumption current is consumed compared to the typical method.

Figure 6:
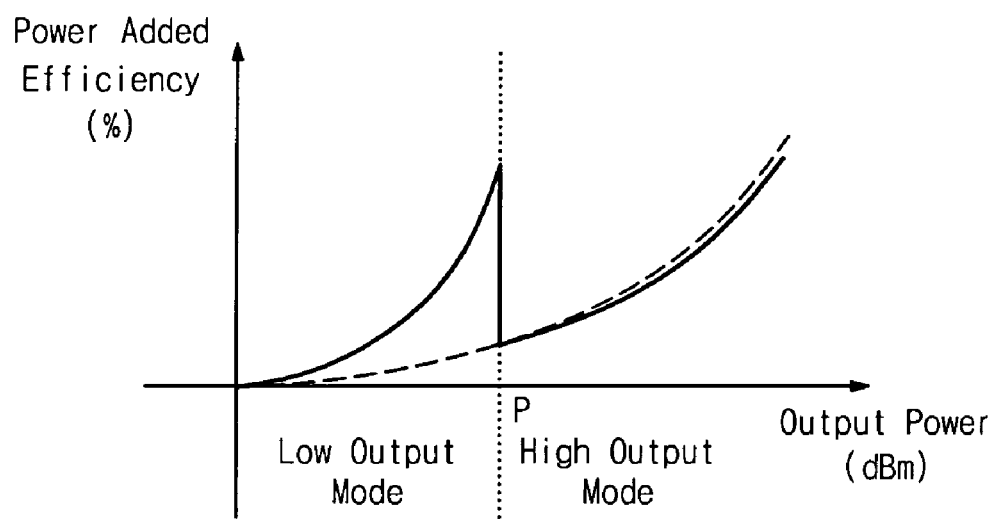
FIG. 6 is a graph illustrating characteristics of the power added efficiency according to a low output mode and a high output mode of a low power consuming mixed mode power amplifier of FIGS. 3A and 3B.

FIG. 6 is a graph illustrating characteristics of the power added efficiency according to low and high output modes of the low power consuming mixed mode power amplifier 1000 of FIGS. 3A and 3B.

Referring to FIGS. 3A, 3B, and 6, the low power consuming mixed mode power amplifier 1000 activates the low output amplifier unit 700 having power efficiency characteristics and deactivates the second amplifier unit 400 and the high output amplifier unit 600 in the low output mode. Therefore, DC consumption due to the second amplifier unit 400 and the high output amplifier unit 600 is reduced. Consequently, characteristics of the power added efficiency are improved in the low output mode. Additionally, the low power consuming mixed mode power amplifier 1000 deactivates the low output amplifier unit 700 and activates the second amplifier unit 400 and the high output amplifier unit 600 in the high output mode. In this case, because the output of the high output amplifier unit 600 is delivered without loss, high added efficiency can be obtained.

Generally, the power amplifier has very low power efficiency when an RF output power is low compared to the inputted DC consumption power. The power added efficiency (PAE) of the power amplifier can be obtained through following Equation PAE(%)=(output RF power−input PF voltage)/input DC power×100. Here, the RF power of the input and output is fixed, and PAE is increased when the input current DC power is low. Thorough this principle, the output voltage of the low output amplifier 700 minimizes the output voltage to maximize the efficiency of the power amplifier unit 1000 in the low output mode.

Referring to FIG. 6, the portion of the dotted line illustrates an added efficiency characteristic of a typical power amplifier when the low power amplifier unit includes a linear power amplifier unit (or, an amplifier unit having a large area). The portion of the solid line illustrates characteristics of the power added efficiency of the power amplifier 1000 when the low output amplifier 700 includes a non-linear power amplifier unit occupying a small area. As illustrated in FIG. 6, the typical power amplifier has an output power having low efficiency at a region (i.e., the most frequently used region) below a predetermined point P (e.g., about 16 dBm). However, because the low output amplifier unit 700 includes the non-linear amplifier unit occupying a small area in the power amplifier 1000, efficiency can be improved in the most frequently used output power region as illustrated in the solid line. That is, according to a structure of the power amplifier 1000, added efficiency of the low output mode can almost reach up to the efficiency of the maximum output power mode (i.e., the high output mode).

Figure 7:
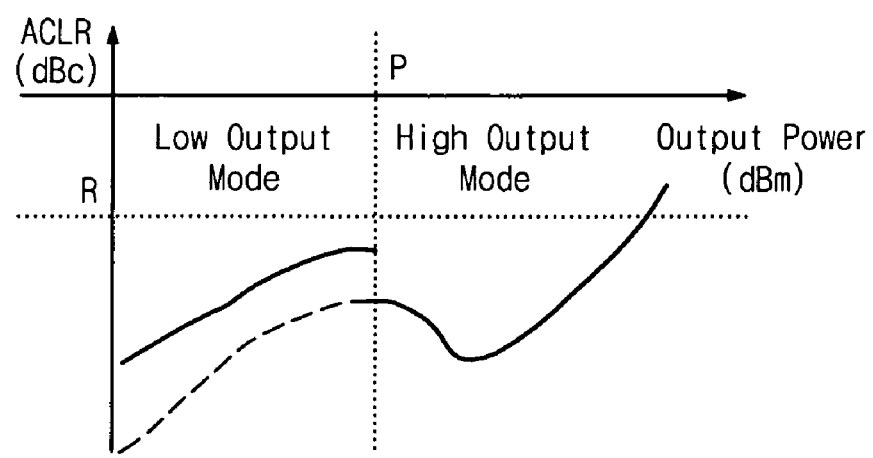
FIG. 7 is a graph illustrating characteristics of the linearity according to an output power of a low power consuming mixed mode power amplifier of FIGS. 3A and 3B.

FIG. 7 is a graph illustrating characteristics of the linearity according to an output power of the low power consuming mixed mode power amplifier 1000 of FIGS. 3A and 3B.

An adjacent channel leakage ratio (ACLR) as an index representing linearity of the power amplifier is used as standard representing linearity of the power amplifier in W-CDMA. The dotted line area below a predetermined point P (e.g., about 16 dBm) illustrates ACLR of the low output mode in the typical power amplifier. Moreover, the portion of the solid line illustrates ACLR of the power amplifier 1000 using the non-linear amplifier as the low output amplifier.

Referring to FIGS. 3A, 3B, and 7, the power amplifier 1000 uses a linear amplifier unit having a large area as the high output amplifier unit 600 in the high output mode. Accordingly, this satisfies the standard (i.e., linearity of the power amplifier) of the predetermined ACLR. However, the non-linear amplifier having a small area is used as the amplifier unit 700 in the low output mode. Accordingly, the value of the ACLR in the low output mode may increase, compared to the ACLR value (the portion of the dotted line in FIG. 7) of the low output mode in the typical power amplifier. However, because once the increased ACLR value is limited to a region of the arbitrary standard (a dotted extension line of a point R), the linearity can be maintained within a predetermined range defined by the standard. Therefore, the standard of the system can be easily satisfied.

FIGS. 8 through 13 are block diagrams of low power consuming mixed mode power amplifiers 2000 to 7000, respectively, according to another embodiment of the present invention.

Figure 8:
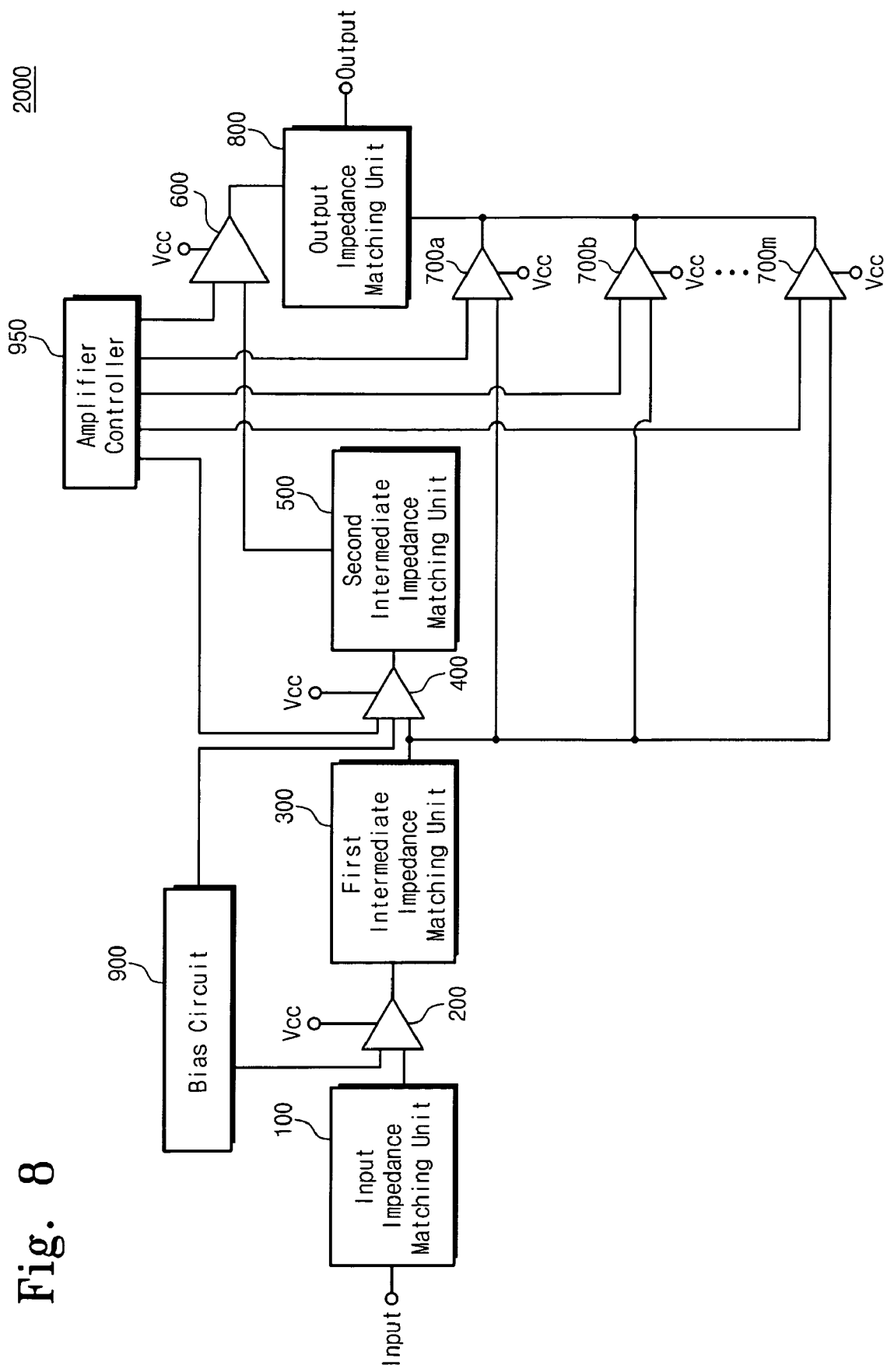
FIGS. 8 through 13 are block diagrams of low power consuming mixed mode power amplifiers, respectively, according to another embodiment of the present invention.

A low power consuming mixed mode power amplifier 2000 of FIG. 8 is identical to that of FIGS. 3A and 3B except for a plurality of non-linear amplifiers units 700a to 700m connected in parallel. The same reference number refers to the same part, and its overlapping description will be omitted for conciseness.

Referring to FIG. 8, a plurality of low output amplifier units 700a to 700m (a and m is a positive integer) includes non-linear amplifier units having high power efficiency and operates in a low output mode of the most frequently used region (e.g., a region where an output power is below about 16 dBm). Each of the low output amplifier units 700a to 700m may be configured to have respectively different high efficiency operation regions in a power level of an input signal. Each of the low output amplifier units 700a to 700m may be selectively activated in the low output mode of the most frequently used region according to control of the amplifier controller 950. For example, only the first low output amplifier unit 700a can be activated, or only the first and second low output amplifier units 700a and 700b can be activated among the low output amplifier units 700a to 700m in the low output mode of the most frequently used region. Or, only the m$^{th}$ low output amplifier unit 700m can be activated in the low output mode of the most frequently used region. Selective activate operations about the low output amplifier units 700a to 700m can obtain a plurality of optimized points generating the maximum efficiency. Accordingly, efficiency of the power amplifier 2000 is maximized and due to this, a battery usage time of a mobile communication terminal and a mobile phone can be more effectively extended.

Figure 9:
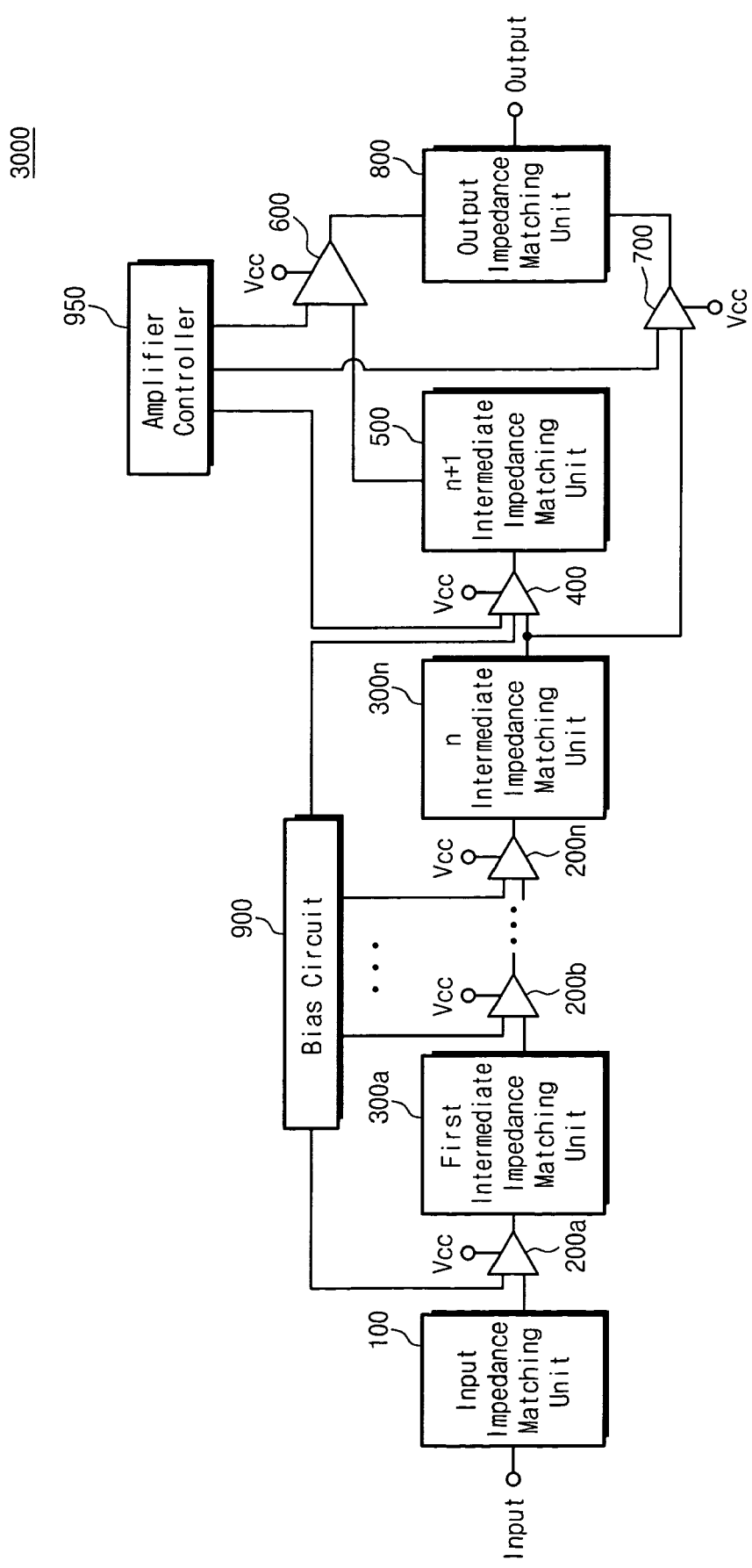

Referring to FIG. 9, a low power consuming mixed mode power amplifier 3000 is identical to that of FIGS. 3A and 3B except that a plurality of first amplifier units 200a to 200n (a and n is a positive integer) is connected in series to a plurality of corresponding intermediate impedance-matching units 300a to 300n. Accordingly, the same reference number refers to the same part, and its overlapping description will be omitted for conciseness.

Referring to FIG. 9, the first amplifier units 200a to 200n and corresponding intermediate impedance-matching units 300a to 300n receive a drive voltage from the bias circuit 900. Output terminals of the first amplifier units 200a to 200n are connected to the corresponding intermediate impedance-matching units 300a to 300n, respectively. The input impedance-matching unit 100 impedance matches and outputs an RF signal inputted from the outside. The impedance-matching result of the input impedance-matching unit 100 is amplified and impedance-matched through the first amplifier units 200a to 200n and the corresponding intermediate impedance-matching units 300a to 300n. The impedance-matching result of the n$^{th}$ intermediate impedance-matching unit 300n is provided to the second amplifier unit 400 and the low output amplifier unit 700.

The power amplifier 3000 controls and turns off the low output amplifier unit 700 during the high output mode operation, and controls and turns on the second amplifier unit 400 and the high output amplifier unit 600. At this point, the impedance-matching result of the $n^{th}$ intermediate impedance-matching unit 300$n$ is provided into the second amplifier unit 400. The power amplifier 3000 turns off the second amplifier unit 2400 and the high output amplifier unit 600 and turns on the low output amplifier unit 700 during the low output mode operation. At this point, the impedance-matching result of the $n^{th}$ intermediate impedance-matching unit 300$n$ is provided to the low output amplifier unit 700. According to this structure, a gain of the power amplifier in the high output mode and the low output mode has a difference as much as a gain of the second amplifier unit 400.

On the other hand, as illustrated in FIG. 9, a structure of a power amplifier including a plurality of the divided first amplifier units 200$a$ to 200$n$ provides a gain required by a system. Especially, when realizing a power amplifier that operates in a high frequency region, there is limitation in a small gain of each unit itself. However, if a gain is adjusted step by step through the first amplifier units 200$a$ to 200$n$ according to the present invention, a small gain of each amplifier unit can sufficiently satisfy a gain required by the system.

Figure 10:
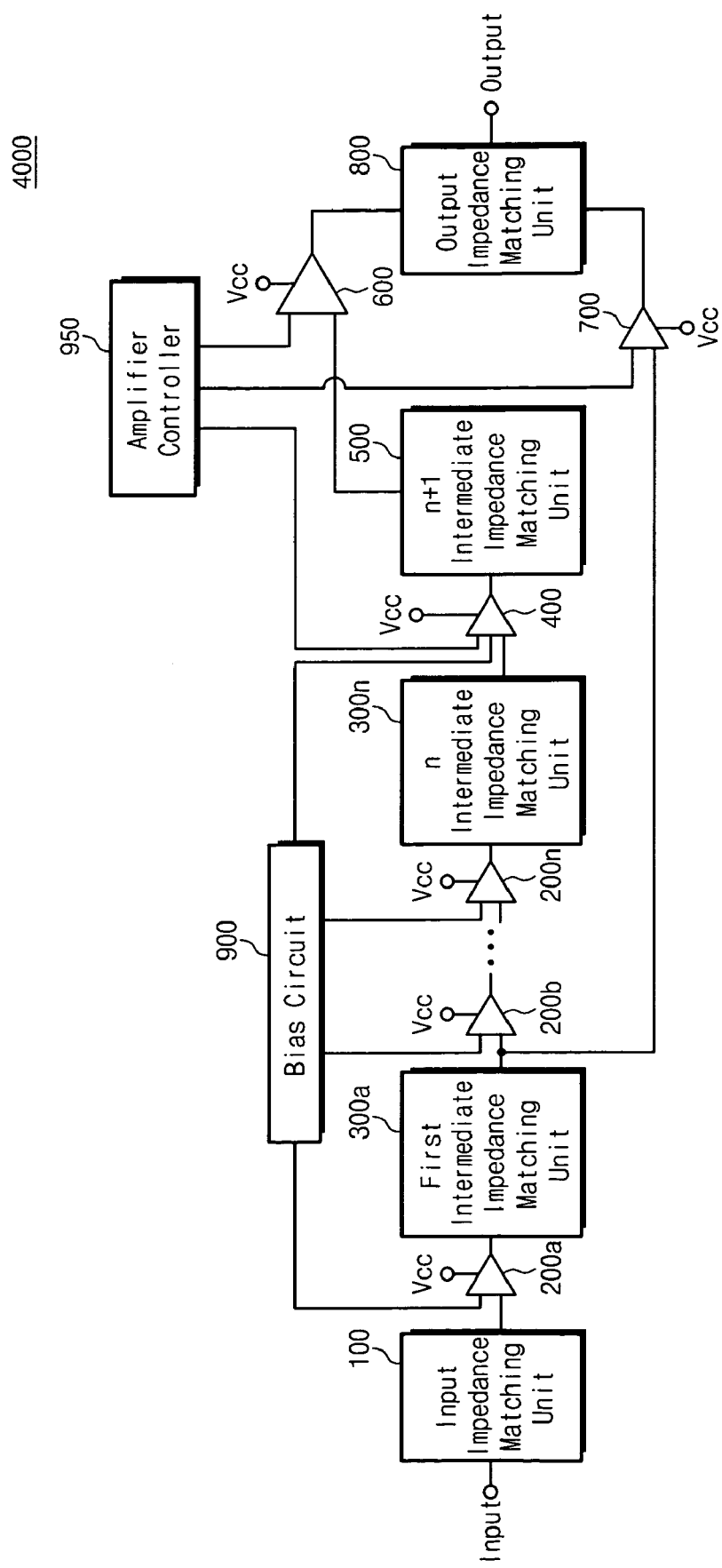

Referring to FIG. 10, a low power consuming mixed mode power amplifier 4000 is substantially identical to that of FIG. 9 except for an input signal path of the low output amplifier unit 700. Accordingly, the same reference refers to the same part, and its overlapping description will be omitted for conciseness.

Referring to FIG. 10, the second amplifier unit 400 and the high output amplification 600 are turned off according to control of the amplifier controller 950 and the input impedance-matching result is provided to the low output amplifier unit 700 through the first amplifier unit 200$a$ and the first intermediate impedance-matching unit 300$a$ during the low output mode operation. Unlike this, during the high output mode operation, the low output amplifier unit 700 is turned off according to control of the amplifier controller 950 and the input impedance-matching result is amplified and impedance-matched through the first amplifier units 200$a$ to 200$n$ and corresponding intermediate impedance-matching units 300$a$ to 300$n$. The impedance-matching result of the $n^{th}$ intermediate impedance-matching unit 300$n$ is provided to the $n-1^{th}$ intermediate impedance-matching unit 500 and the high output amplifier unit 600 through the second amplifier unit 400. According to this structure, the gain of the amplifier 4000 in the high and low output modes has a difference as much as a gain of the first amplification units 200$b$ to 200$n$ (the number of n−1) and the second amplifier unit 400. Here, the gain of the amplifier 4000 in the high and low output modes may be modified in various forms by changing an input signal path of the low output amplifier unit 700. The change of the input signal path of the low output amplifier unit 700 can be accomplished by changing the connection relationship of the first amplifier units 200$a$ to 200$n$ and the low output amplifier unit 700.

Figure 11:
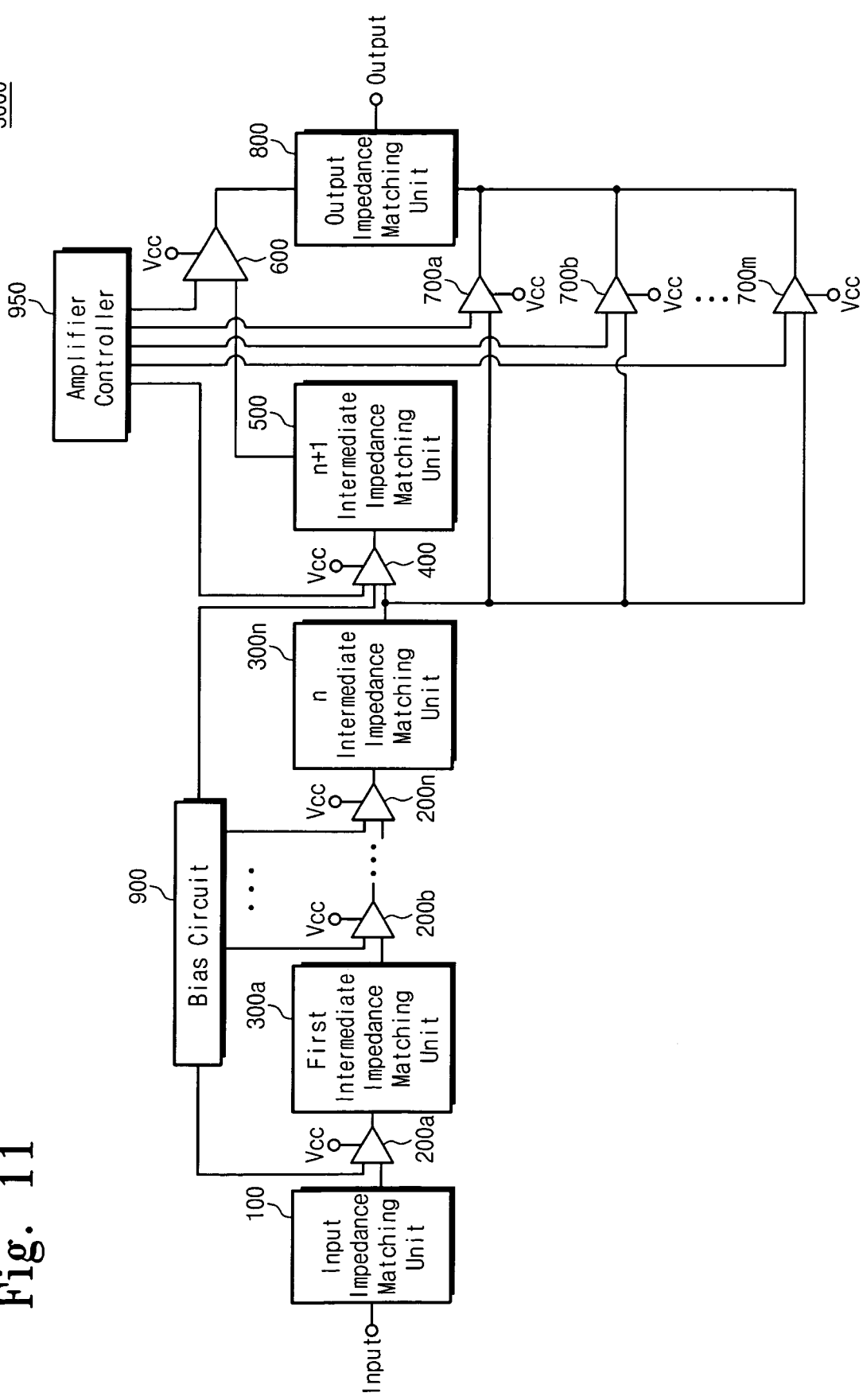

Referring to FIG. 11, a low power consuming mixed mode power amplifier 5000 is substantially identical to that of FIG. 9 except for non-linear amplifier units 700$a$ to 700$m$ connected in parallel. Accordingly, the same reference number refers to the same part, and its overlapping description will be omitted for conciseness.

Referring to FIG. 11, a plurality of low output amplifier units 700$a$ to 700$m$ (a and m is a positive integer) includes non-linear amplifier units of high power efficiency. According to control of the amplifier controller 950, the low output amplifier units 700$a$ to 700$m$ operate in a low output mode of the most frequently used region (e.g., a region where an output power is below about 16 dBm). Each of the low output amplifier units 700$a$ to 700$m$ can be selectively activated in the low output mode of the most frequently used region according to control of the amplifier controller 950. For example, only the first low output amplifier unit 700$a$ is activated, or only the first and second low output amplifier units 700$a$ and 700$b$ are activated among the low output amplifier units 700$a$ to 700$m$ in the low output mode of the most frequently used region. Or, only the $m^{th}$ low output amplifier unit 700$m$ can be activated in the low output mode of the most frequently used region. Selective activate operations for the low output amplifier units 700$a$ to 700$m$ can obtain a plurality of optimized points generating the maximum efficiency. Accordingly, efficiency of the power amplifier 2000 is maximized and due to this, a battery usage time of a mobile communication terminal and a mobile phone can be more effectively extended.

Referring to 12, a low power consuming mixed mode power amplifier 6000 is identical to that of FIG. 11 except for the input signal path of the low output amplification 700. Accordingly, the same reference number refers to the same part, and its overlapping description will be omitted for conciseness, and its overlapping description will be omitted for conciseness.

Figure 12:
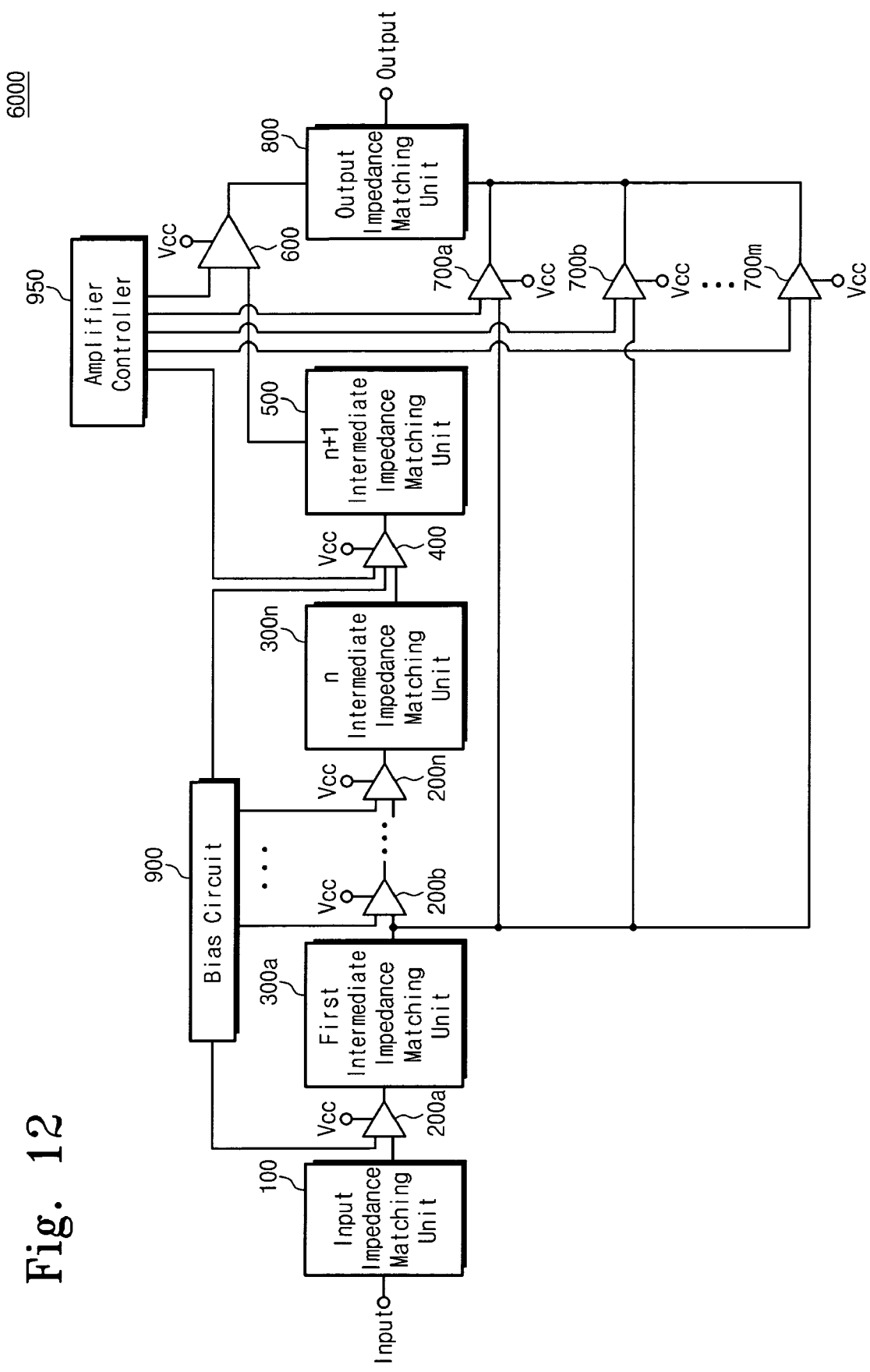

Referring to FIG. 12, a plurality of low output amplifications 700$a$ to 700$m$ (a and m is a positive integer) is selectively activated in the low output mode of the most frequently used region according to control of the amplifier controller 950 in the low output mode. The activated low output amplifier units 700$a$ to 700$m$ receive and amplify the impedance-matching result of the first intermediate impedance-matching unit 300$a$. Also, the low output amplifier units 700$a$ to 700$m$ are turned off according to control of the amplifier controller 950 during the high output mode operation. Additionally, the impedance-matching result of the first intermediate impedance-matching unit 300$a$ is amplified and impedance-matched through the first amplifier units 200$b$ to 200$n$ and the corresponding intermediate impedance-matching units 300$b$ to 300$n$. Then, the impedance-matching result is sequentially provided to the $n-1^{th}$ intermediate impedance-matching unit 500 and the high output amplifier unit 600 through the second amplifier unit 400. According to this structure, the gain of the amplifier 600 in the high and low output modes can be freely adjusted and the optimized points generating the maximum efficiency can be achieved. Accordingly, efficiency of the power amplifier 600 is maximized and due to this, a battery usage time of a mobile communication terminal and a mobile phone can be more effectively extended.

Figure 13:
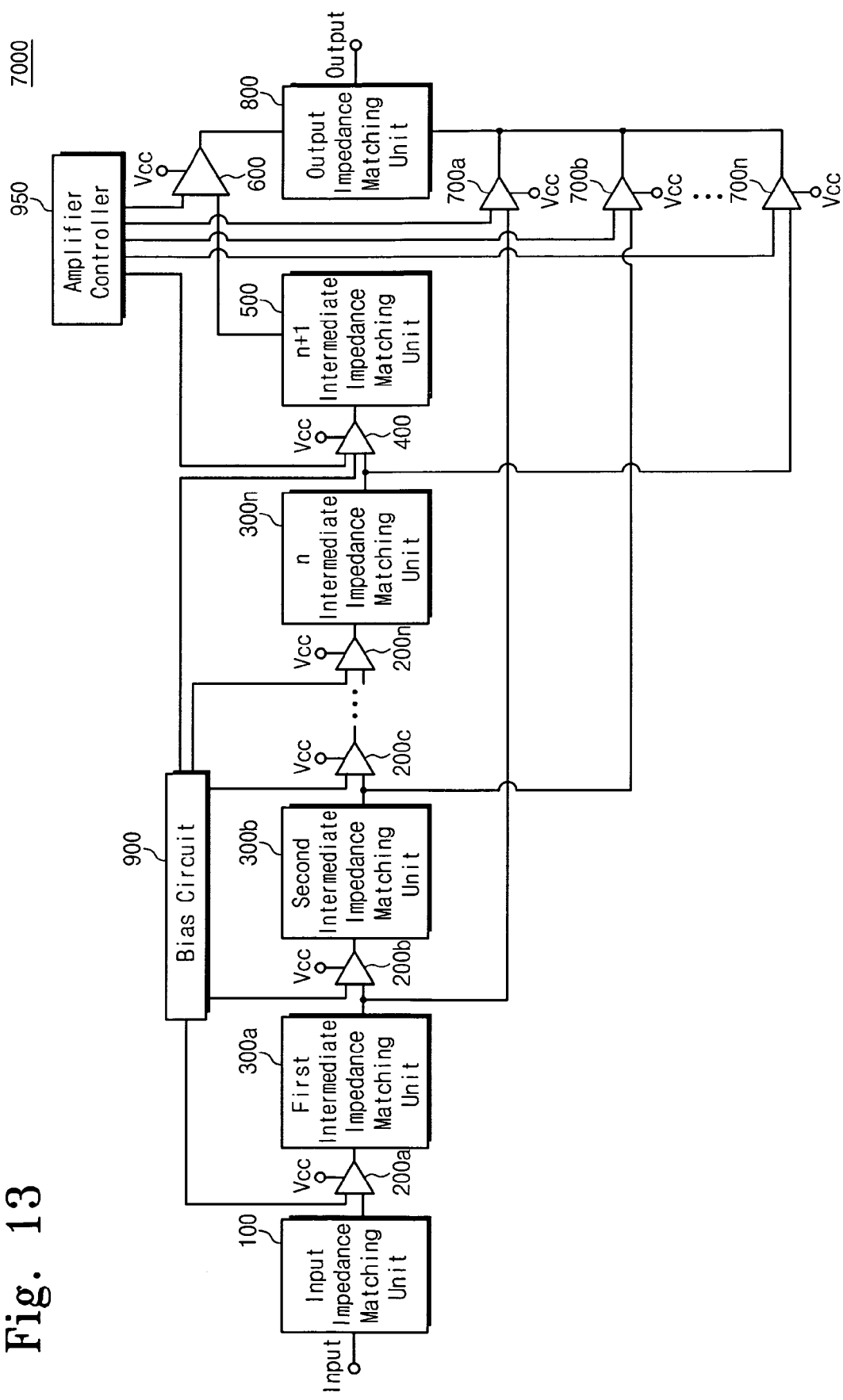

Referring to FIG. 13, a low power consuming mixed mode power amplifier 7000 is identical to that of FIG. 12 except for the input signal path of the low output amplification 700. Accordingly, the same reference number refers to the same part, and its overlapping description will be omitted for conciseness.

Referring to FIG. 13, the low output amplifier units 700$a$ to 700$n$ (a and n is a positive integer) receive and amplify outputs of intermediate impedance-matching units 300$b$ to 300$n$ (b and n is a positive integer), respectively, during the low output mode operation. During the low output mode operation, the second amplifier unit 400 and the high output amplifier unit 600 are turned off according to control of the amplifier controller 950. As illustrated in FIG. 13, the low output amplifier units 700$a$ to 700$n$ correspond to the intermediate impedance-matching units 300$b$ to 300$n$, respectively. However, the number of low output amplifier units, the number of intermediate impedance-matching units, and the connection relationship between them can be modified in various forms.

Additionally, a method of selectively activating the n number of the low output amplifier units 700a to 700n can be modified in various forms.

According to the above structure, amplifier units having a small gain can sufficiently satisfy a gain required by a system. Additionally, the gain of the amplifier 700 in the high and low output modes can be freely adjusted and the optimized points generating the maximum efficiency can be obtained. Accordingly, the efficiency of the power amplifier 7000 is maximized and due to this, a battery usage time of the mobile communication terminal and phone can be more effectively extended.

On the other hand, the amplifier units (e.g., the first amplification unit and the low output amplifier unit) of the present invention can be realized by a bipolar transistor as an example, but this is just one example for the present invention. It is apparent to those skilled in the art that the amplifier unit of the present invention can be realized by one (or, combination) of a HBT array, a BJT array, a FET array, and a CMOS array.

Additionally, the number of amplifier units can vary according to the overall signal amplification degree required by a system. For example, in a case where a low amplification degree is required, the first amplifier unit 200 and the first intermediate impedance-matching unit 300 can be omitted. In a case where a high overall signal amplification degree is required, as illustrated in FIGS. 9 through 13, the first amplifier unit (or, the second amplifier unit) can be realized by a multi-stage amplifier including a plurality of amplifier units. Moreover, in a case where a gain difference is large in the high and low output modes and a signal of the low output mode is required to be low, as illustrated in FIGS. 10 and 12, the outputs of the first amplifier unit 200a and the first intermediate impedance-matching unit 300a can be directly connected to the low output amplifier unit 700. As illustrated in FIGS. 8 and 11 through 13, the low output amplifier units 700a to 700m or 700a to 700n are connected in parallel, and outputs of the first intermediate impedance-matching units 300a to 300n can be selectively connected to the low output amplifier units 700a to 700m or 700a to 700n, respectively. As a result, a gain difference between the high output amplifier unit 600 and the low output amplifier units 700a to 700m or 700a to 700n can be freely adjusted.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A power amplifier comprising:
    a low output amplifier unit generating a first output amplified result having high efficiency in a low output mode the most frequently used;
    a high output amplifier unit generating a second output amplified result having high linearity in a high output mode of a region consuming the most power;
    a gain controller amplifying an input signal through a plurality of intermediate amplifier units each having a predetermined gain difference from other intermediate amplifier units, providing a first intermediate amplified result to the high and low output amplifier units and providing a second intermediate amplified result only to the high output amplifier unit; and
    an amplifier controller selectively activating the low and high output amplifier units according to a power level of the input signal.

2. The power amplifier of claim 1, wherein the gain controller comprises:
    an input impedance-matching unit configured to impedance match the input signal;
    a first intermediate amplifier unit amplifying the input impedance-matching result in the low and high output modes and generating the first intermediate amplified result;
    a first intermediate impedance-matching unit configured to impedance match the first intermediate amplified result of the first intermediate amplifier unit in the low and high output modes;
    a second intermediate amplifier unit amplifying the first intermediate impedance-matching result in the high output mode and generating the second intermediate amplified result; and
    a second intermediate matching unit configured to impedance match the second intermediate amplified result of the second intermediate amplifier unit in the high output mode.

3. The power amplifier of claim 2, wherein the high and low output amplifier units have a gain difference corresponding to a gain of the second intermediate amplifier unit.

4. The power amplifier of claim 1, wherein the gain difference is adjustable.

5. The power amplifier of claim 1, further comprising a bias circuit supplying an operation voltage to the gain controller.

6. The power amplifier of claim 1 further comprising an output impedance-matching unit configured to impedance match the first and second output amplified results of the low and high output amplifier units.

7. The power amplifier of claim 1, wherein the low output amplifier unit operates in the low output mode and does not operate in the high output mode in response to control of the amplifier controller.

8. The power amplifier of claim 1, wherein the low output amplifier unit is a non-linear amplifier having high power efficiency.

9. The power amplifier of claim 1, wherein the low output amplifier unit is a class E amplifier.

10. The power amplifier of claim 1, wherein the low output amplifier unit comprises a plurality of non-linear amplifier units having respectively different high efficiency operation regions.

11. The power amplifier of claim 10, wherein each of the non-linear amplifier units is selectively activated in the low output mode according to control of the amplifier controller.

12. The power amplifier of claim 10, wherein the non-linear amplifier units are connected in parallel.

13. The power amplifier of claim 2, wherein the second intermediate amplifier unit and the high output amplifier unit operate in the high output mode and do not operate in the low output mode in response to control of the amplifier controller.

14. The power amplifier of claim 1, wherein the high output amplifier unit is one of a class A amplifier and a class AB amplifier having high linearity.

15. The power amplifier of claim 2, wherein the high output amplifier has a larger area than the first amplifier unit and the low amplifier unit.

16. The power amplifier of claim 1, wherein each of the high output amplifier unit and the low output amplifier unit comprises one of a heterojunction bipolar transistor (HBT) array, a bipolar junction transistor (BJT) array, a field effect transistor (FET) array, and a complementary metal oxide semiconductor (CMOS) array.

17. The power amplifier of claim 2, wherein the first intermediate amplifier unit comprises a multi-stage amplifier in which a plurality of amplifier units is connected in series.

18. The power amplifier of claim 17, wherein the first intermediate impedance-matching unit comprises a plurality of intermediate impedance-matching units corresponding to the amplifier units of the first intermediate amplifier, respectively, and each of the intermediate impedance-matching units is connected between the amplifier units connected in series.

19. The power amplifier of claim 18, wherein at least one output of the intermediate impedance-matching units is provided to the low output amplifier unit.

20. A power amplifier comprising:
an input impedance-matching unit configured to impedance match an input signal;
a first intermediate amplifier unit including a plurality of amplifier units connected in series to sequentially amplify the input impedance-matching result and generating a first intermediate amplified result;
a plurality of first intermediate impedance-matching units connected between the amplifier units of the first intermediate amplifier unit to impedance match an output of each of the amplifier units, the amplifier units being connected in series;
a low output amplifier unit amplifying at least one impedance-matching result of the first intermediate impedance-matching units and generating a first output amplified result in a low output mode;
a second intermediate amplifier unit amplifying the impedance-matching result of the last first impedance-matching unit in the first intermediate impedance-matching units and generating a second intermediate amplified result in a high output mode;
a second intermediate impedance-matching unit impedance-matching the second intermediate amplified result of the second intermediate amplifier unit in the high output mode;
a high output amplifier unit amplifying the second intermediate impedance-matching result and generating a second output amplified result in the high output mode;
an amplifier controller controlling amplification operations of the low output amplifier unit, the second intermediate amplifier unit, and the high output amplifier unit in response to a power level of the input signal; and
an output impedance-matching unit impedance-matching the first and second output amplified results of the low and high output amplifier units.

21. The power amplifier of claim 20, wherein the low output amplifier unit amplifies the impedance-matching result of the last one of the first impedance-matching units.

22. The power amplifier of claim 20, wherein the low output amplifier unit amplifies the impedance-matching result of the first one of the first impedance-matching units.

23. The power amplifier of claim 20, wherein the low output amplifier unit amplifies impedance-matching results generated from the respective first impedance-matching units.

24. The power amplifier of claim 20, further comprising a bias circuit supplying an operation voltage to the first and second intermediate amplifier units.

* * * * *